(12) United States Patent
Yee et al.

(10) Patent No.: US 6,642,756 B1
(45) Date of Patent: Nov. 4, 2003

(54) FREQUENCY MULTIPLIER DESIGN

(75) Inventors: Gin Yee, Sunnyvale, CA (US);
Sudhakar Bobba, Sunnyvale, CA (US);
Lynn Ooi, Santa Clara, CA (US);
Pradeep Trivedi, Sunnyvale, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/202,798

(22) Filed: Jul. 25, 2002

(51) Int. Cl.[7] ............................................. H03B 19/00
(52) U.S. Cl. ...................... 327/116; 327/172; 327/198
(58) Field of Search ................................ 327/116, 172, 327/158, 197, 198, 199, 175; 377/47, 48

(56) References Cited

U.S. PATENT DOCUMENTS 5,642,068 A * 6/1997 Wojcicki et al. ............ 327/172
6,489,824 B2 * 12/2002 Miyazaki et al. ............ 327/158

* cited by examiner

*Primary Examiner*—Tuan T. Lam
*Assistant Examiner*—Hiep Nguyen
(74) *Attorney, Agent, or Firm*—Rosenthal & Osha L.L.P.

(57) ABSTRACT

A frequency multiplier design that uses a flip-flop to output (1) a first edge on an output clock signal upon receipt of a first transition of an input clock signal and (2) a second edge on the output clock signal before receipt of a second transition of the input clock signal is provided. The frequency multiplier design uses circuitry dependent on the output clock signal to reset the flip-flop after some delay but before the second transition of the input clock signal, wherein the resetting of the flip-flop causes the flip-flop to output the second edge on the output clock signal.

15 Claims, 4 Drawing Sheets

FREQUENCY MULTIPLIER DESIGN

BACKGROUND OF INVENTION

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To this end, a crystal oscillator 18 generates a system clock signal sys_clk (also referred to in the art as "reference clock") to various parts of the computer system 10. However, modern microprocessors and other integrated circuits typically operate at frequencies significantly higher than that of the signals most crystal oscillators can provide, and accordingly, designers often implement various techniques to increase or multiply the frequency of the system clock signal to particular computer system components.

For example, as shown in FIG. 1, because the microprocessor 12 is able to operate at frequencies higher than that of the system clock signal sys_clk, a phase locked loop 22 is often used to output a chip clock signal chip_clk to the microprocessor 12, in which case, the chip clock signal chip_clk has a frequency that is significantly higher than that of the system clock signal sys_clk. However, in some circumstances, although frequency multiplication may be needed, implementation of a complex clock generator, such as the phase locked loop 22 shown in FIG. 1, may prove to be difficult or too costly in terms of space and design time.

To this end, integrated circuit designers have implemented various simpler frequency multiplier designs, one of which is shown in FIG. 2. In FIG. 2, an exclusive-OR gate 30 has a first input 32 operatively connected to a first clock nal clk_in and an output 34 operatively connected to a second clock signal clk_out. A delay chain 38 formed by a series inverters 40 has an input 42 operatively connected to the first clock signal clk_in and an output operatively connected to a second input 44 of the exclusive-OR gate 30.

FIG. 3 shows a timing diagram in accordance with the typical frequency multiplier design shown in FIG. 2. The timing diagram shows clock waveforms for the first clock signal $clk_{13}$ in (at the first input 32 of the exclusive-OR gate 30 shown in FIG. 2), the second input 44 of the exclusive-OR gate 30 shown in FIG. 2, and the second clock signal clk_out (at the output 34 of the exclusive-OR gate 30 shown in FIG. 2).

As shown in FIG. 3, the clock waveform at the second input 44 is delayed with respect to the clock waveform of the first input 32 (due to the delay of the delay chain 38 shown in FIG. 2). Because the exclusive-OR gate 30 outputs 'high' when its inputs are different, and because the clock waveforms at the first input 32 and the second input 44 are different after each rising and falling edge for a period of time less than half a clock waveform cycle at the first input 32 (and at the second input 44), the clock waveform for the. output 34 of the exclusive-OR gate 30, i.e., the second clock signal clk_out, has a frequency twice that of the first clock signal clk_in.

SUMMARY OF INVENTION

According to one aspect of the present invention, an integrated circuit comprises a flip-flop with a clock input operatively connected to a first clock signal and an output operatively connected to a second clock signal, a pulse generator with an input operatively connected to the second clock signal, and a voltage controlled delay element with an input operatively connected to an output of the pulse generator and an output operatively connected to a reset input of the flip-flop.

According to another aspect, an integrated circuit comprises flip-flop means for in putting a first transition of a first clock signal and outputting a first type of edge on a second clock signal upon receipt of the first transition, and means for resetting the flip-flop means before the flip-flop means inputs a second transition of the first clock signal, where the flip-flop means outputs a second type of edge on the second clock signal dependent on the means for resetting the flip-flop means.

According to another aspect, a method for multiplying a frequency of a first clock signal comprises generating a first type of edge on a second clock signal upon receipt of a first transition of the first clock signal, generating a pulse dependent on the first type of edge, delaying the pulse, and generating a second type of edge on the second clock signal upon receipt of the pulse.

Other aspects and advantages of the invention will be apparent from the following description and the appended claims.

DETAILED DESCRIPTION

Embodiments of the present invention relate to a frequency multiplier design that uses a flip-flop to output (1) a first edge on an output clock signal upon receipt of a first transition of an input clock signal and (2) a second edge on the output clock signal before receipt of a second transition of the input clock signal. The frequency multiplier design uses circuitry dependent on the output clock signal to reset the flip-flop after some delay but before the second transition of the input clock signal, wherein the resetting of the flip-flop causes the flip-flop to output the second edge on the output clock signal.

Figure 1:
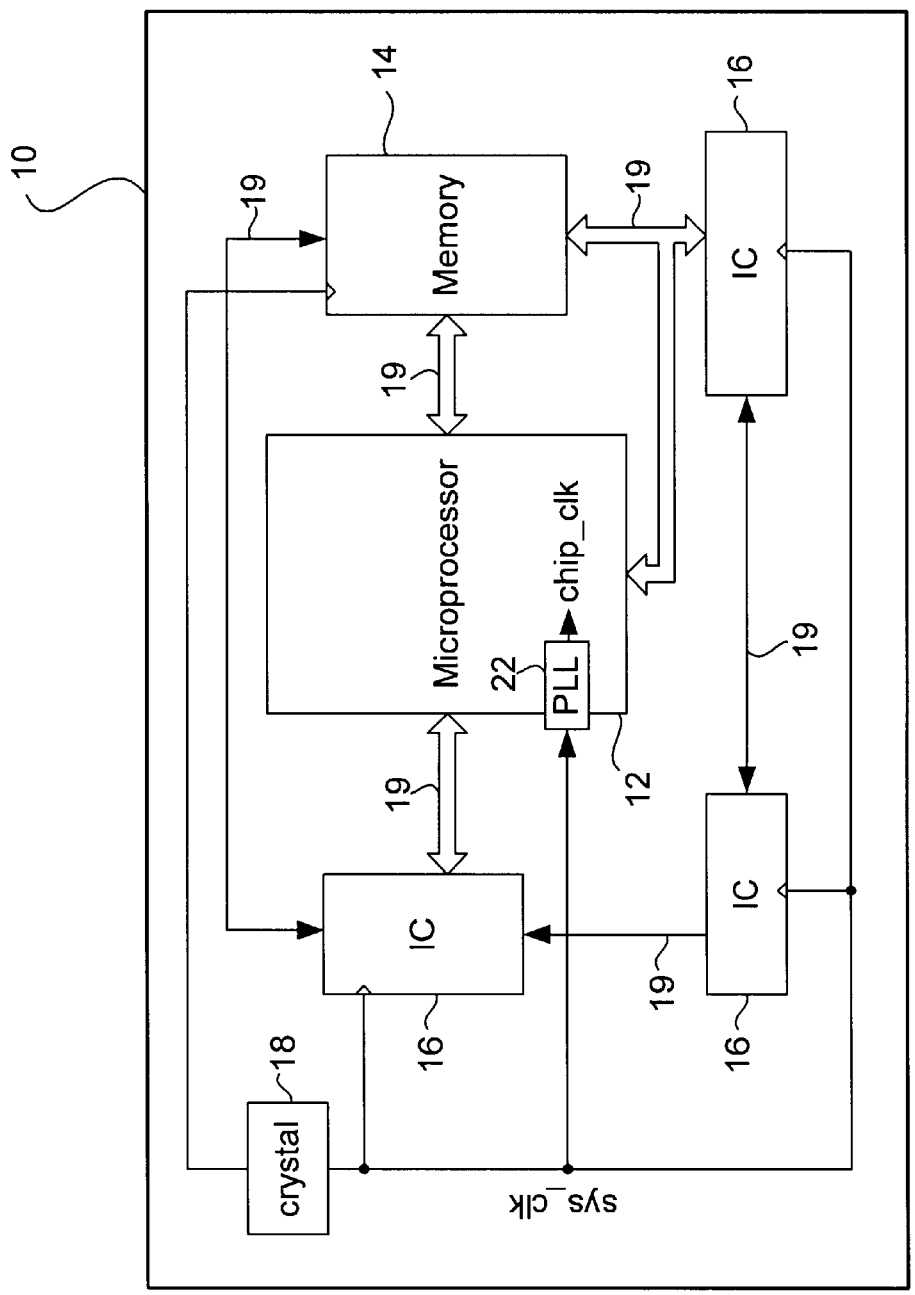
FIG. 1 shows a typical computer system.
Figure 2:
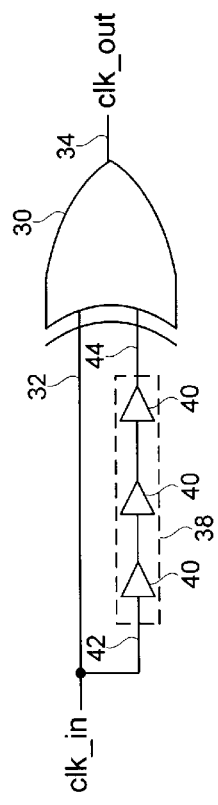
FIG. 2 shows a typical frequency multiplier design.
Figure 3:
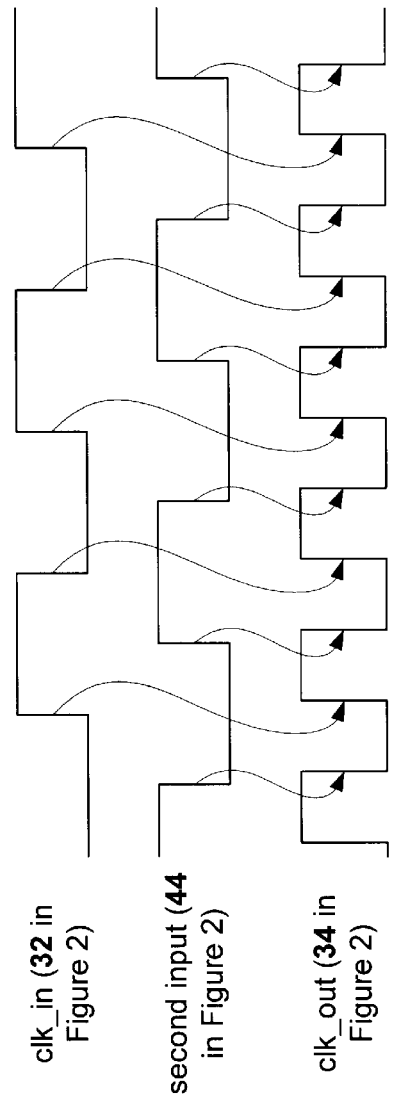
FIG. 3 shows a timing diagram in accordance with the typical frequency multiplier design shown in FIG. 2.
Figure 4:
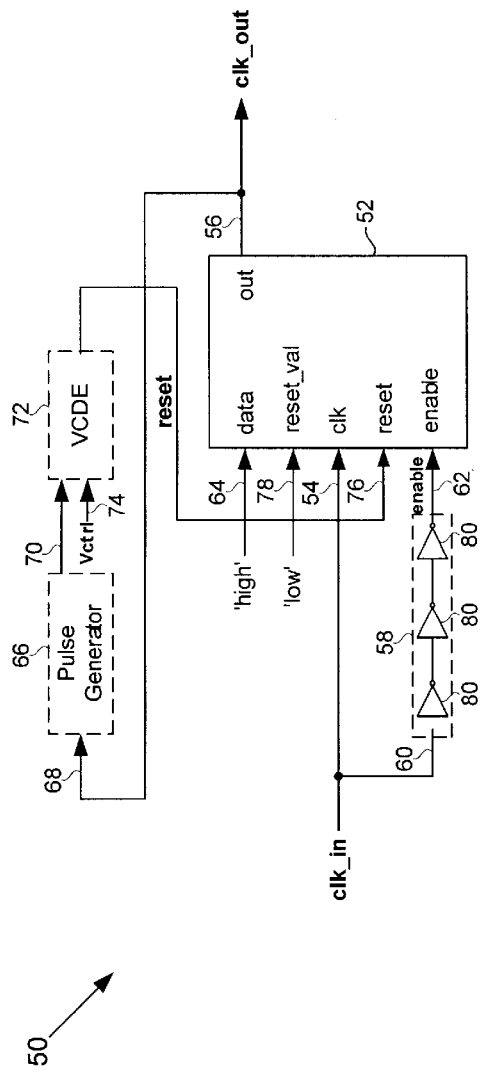
FIG. 4 shows a frequency multiplier design in accordance with an embodiment of the present invention.

FIG. 4 shows a frequency multiplier 50 in accordance with an embodiment of the present invention. The frequency multiplier 50 uses a flip-flop 52 that has a clock input 54 operatively connected to a first clock signal clk_in and an output 56 operatively connected to a second clock signal clk_out. Moreover, the frequency multiplier 50 uses a delay chain 58 that has an input 60 operatively connected to the first clock signal clk_in and an output operatively connected to an edge enable signal enable that is operatively connected to an edge enable input 62 of the flip-flop 52. Depending on the edge enable input 62, the flip-flop 52 is triggered by either a rising (positive) edge or a falling (negative) edge at the clock input 54.

When the clock input 54 is triggered by a first transition on the input clock signal clk_in, the flip-flop 52 outputs a rising (positive) edge on the second clock signal clk_out due to the flip-flop's 52 data input 64 being operatively connected to 'high.' Those skilled in the art will note that, in one or more other embodiments, the flip-flop 52 may be arranged to output a falling (negative) edge on the second clock signal clk_out by operatively connecting the flip-flop's 52 data input 64 to 'low.'

Still referring to FIG. 4, the frequency multiplier 50 uses a pulse generator 66 that has an input 68 operatively connected to the second clock signal clk_out. The pulse generator 66 is used to produce a pulse dependent on the second clock signal clk_out. A more detailed description of the pulse generator 66 is given below with respect to FIG. 5.

The pulse generator 66 has an output 70 operatively connected to a voltage controlled delay element (VCDE) 72 that delays the passage of the pulse produced by the pulse generator 66. In the embodiment shown in FIG. 4, the amount of delay is dependent on a voltage control input, Vctrl 74, to the voltage controlled delay element 72. However, those skilled in the art will understand that the voltage controlled delay element 72 may be arranged to have a delay not dependent on such a voltage control input. A more detailed description of the voltage controlled delay element 72 is given below with respect to FIG. 6.

The voltage controlled delay element 72 outputs the delayed pulse on a reset signal reset that is operatively connected to an output of the voltage controlled delay element 72. The reset signal reset is operatively connected to a reset input 76 of the flip-flop 52, and thus, when the voltage controlled delay element 72 outputs the delayed pulse on the reset, signal reset, the flip-flop 52 is reset, which, in turn, causes the flip-flop 52 to output a falling (negative) edge on the second clock signal clk_out due to the flip-flop's 52 reset value input 78 being operatively connected to 'low.' Those skilled in the art will note that, in one or more other embodiments, the flip-flop 52 may be arranged to output a rising (positive) edge on the second clock signal clk_out by operatively connecting the flip-flop's 52 reset value input 78 to 'high.'

Figure 7:
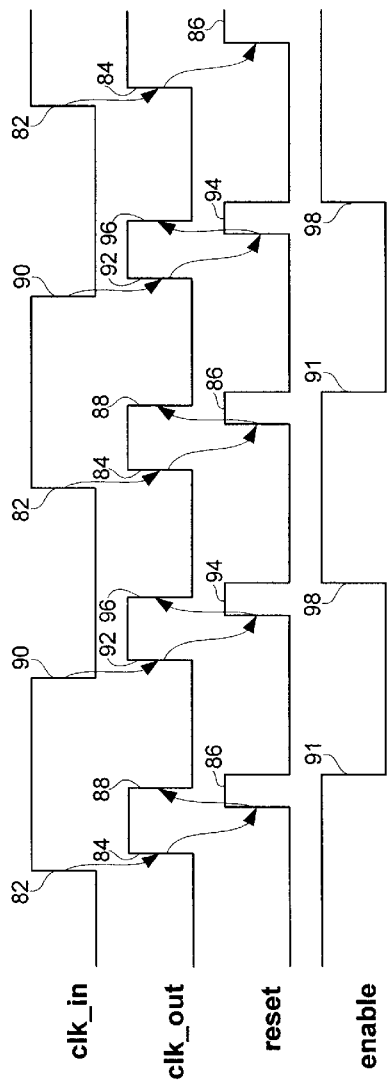
FIG. 7 shows a timing diagram in accordance with the embodiment shown in FIG. 4.

Before receipt of a second transition of the first clock signal clk_in, the delay chain 58, formed by a series of delay elements 80, is arranged to, after some delay, toggle the edge enable input 62 in order to change the type of edge that triggers the flip-flop 52 at the clock input 54. Thus, the flip-flop 52 outputs a 'high' edge on the second clock signal clk_out upon receipt of the second transition of the first clock signal clk_in. Accordingly, by triggering the flip-flop 52 and outputting a first edge on the second clock signal clk_out for every transition of the first clock signal clk_in, and by resetting the flip-flop 52 and outputting a second edge on the second clock signal clk_out between transitions of the first clock signal clk_in, the second output clock signal clk_out is controlled to have a frequency twice than that of the first clock signal clk_in. An exemplary timing diagram of the frequency multiplier's 50 behavior is shown in FIG. 7.

Those skilled in the art will understand that due to the dual edge triggered and resettable behavior of the flip-flop 52, the flip-flop 52 may be referred to as a "dual edge triggered resettable flip-flop."

Figure 5:
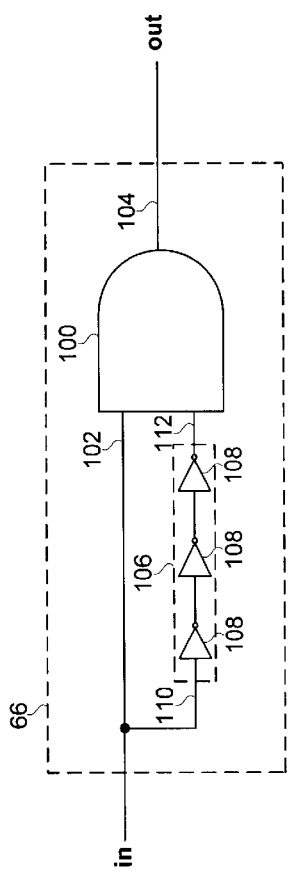
FIG. 5 shows a pulse generator in accordance with the embodiment shown in FIG. 4.

FIG. 5 shows an exemplary pulse generator 66 in accordance with the embodiment shown in FIG. 4. The pulse generator 66 uses a logic gate 100 that has a first input 102 operatively connected to an input in of the pulse generator 66 and an output 104 operatively connected to an output out of the pulse generator 66. The pulse generator 66 also uses a delay chain 106, formed by a series of delay elements 108, that has an input 110 operatively connected to the input in of the pulse generator 66 and an output operatively connected to a second input 112 of the logic gate 100. Accordingly, for every rising (positive) edge on the input in, the pulse generator 66 produces a 'high-going' pulse on the output out. The width of the pulse is determined by the delay of the delay chain 106. Those skilled in the art will understand that, in one or more other embodiments, a different logic gate may be used to produce another type of pulse, e.g., a 'low-going' pulse.

Figure 6:
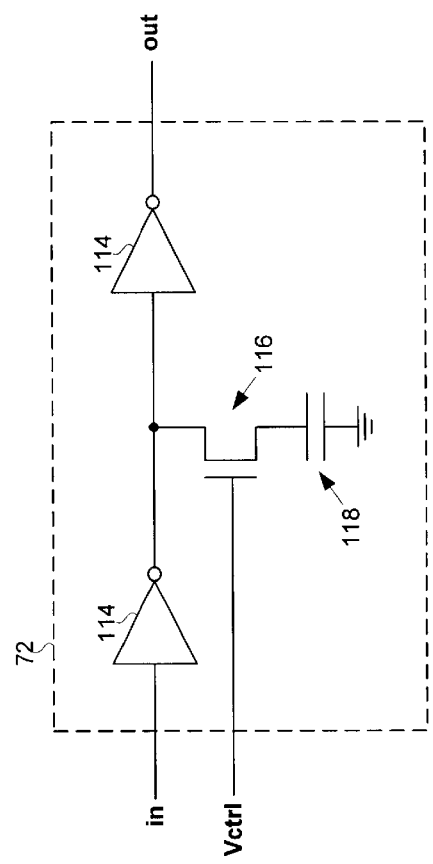
FIG. 6 shows a voltage controlled delay element in accordance with the embodiment shown in FIG. 4.

FIG. 6 shows an exemplary voltage controlled delay element 72 in accordance with the embodiment shown in FIG. 4. The voltage controlled delay element 72 uses a series of delay elements 114 to delay a signal passing from an input in of the voltage controlled delay element 72 to an output out of the voltage controlled delay element 72. The voltage controlled delay element 72 also uses a transistor 116 dependent on a control voltage Vctrl to slow down or speed up the delay between the input in and the output out. In addition to being operatively connected to the series of delay elements 114, the transistor 116 is operatively connected to a capacitor 118 that is used to store/dissipate charge. Those skilled in the art will understand that, in one or more other embodiments, other means for regulating the delay between the input in and the output out may be implemented.

To exemplify the behavior of the frequency multiplier 50 shown in FIG. 4, FIG. 7 shows an exemplary timing diagram in accordance with the frequency multiplier 50 shown in FIG. 4. The timing diagram shows waveforms for the first clock signal clk_in (at the clock input 54 of the flip-flop 52 shown in FIG. 4), the second clock signal clk_out (at the output 56 of the flip-flop 52 shown in FIG. 4), the reset signal reset (at the reset input 76 of the flip-flop 52 shown in FIG. 4), and the edge enable signal enable (at the edge enable input 62 of the flip-flop 52 shown in FIG. 4).

Referring to FIG. 7 and assuming that the flip-flop (52 in FIG. 4) is initially in a rising (positive) edge triggered state, when a rising (positive) edge 82 occurs on the first clock signal clk_in, the flip-flop (52 in FIG. 4) outputs a rising (positive) edge 84 on the second clock signal clk_out. Based on this rising (positive) edge 84 on the second clock signal clk_out, the pulse generator (66 in FIG. 4) and the voltage controlled delay element (72 in FIG. 4) produce a pulse 86 on the reset signal reset. This pulse 86 on the reset signal reset, which is operatively connected to the reset input (76 in FIG. 4), resets the flip-flop (52 in FIG. 4), which, in turn, causes the flip-flop (52 in FIG. 4) to output a falling (negative) edge 88 on the second clock signal clk_out.

Before a falling (negative) edge 90 occurs on the first clock signal clk_in, the delay chain (58 in FIG. 4) toggles 91 the edge enable signal enable, which, in turn, causes the flip-flop (52 in FIG. 4) to go to a falling (negative) edge triggered state. Accordingly, upon receipt of a falling (negative) 90, the flip-flop (52 in FIG. 4) outputs a rising (positive) edge 92 on the second clock signal clk_out. Based on this rising (positive) edge 92 on the second clock signal clk_out, the pulse generator (66 in FIG. 4) and the voltage controlled delay element (72 in FIG. 4) produce a pulse 94 on the reset signal reset. This pulse 94 on the reset signal reset, which is operatively connected to the reset input (76 in FIG. 4), resets the flip-flop (52 in FIG. 4), which, in turn, causes the flip-flop (52 in FIG. 4) to output a falling (negative) edge 96 on the second clock signal clk_out before receipt of the next rising (positive) edge 82 on the first clock signal clk_in. Before the next rising (positive) edge 82 occurs on the first clock signal clk_in, the delay chain (58 in FIG. 4) toggles 98 the edge enable signal enable, which, in turn, causes the flip-flop (52 in FIG. 4) to go back to a rising (positive) edge triggered state. Accordingly, as evident from FIG. 5, the frequency of the second clock signal clk_out has a frequency twice than that of the first clock signal clk_in.

Advantages of the present invention may include one or more of the following. In one or more embodiments, because a simple frequency multiplier may be used instead of a complicated clock generator, e.g., a phase locked loop, valuable integrated circuit space and design time may be saved.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:

a flip-flop with a clock input operatively connected to a first clock signal wherein the flip-flop is arranged to generate a second clock signal;

a pulse generator with an input operatively connected to the second clock signal; and a voltage controlled delay element with an input operatively connected to an output of the pulse generator and an output operatively connected to a reset input of the flip-flop, wherein the flip-flop is a dual-edge triggered resettable flip-flop.

2. The integrated circuit of claim 1, wherein the flip-flop is arranged to cause the second clock signal to have a frequency greater than that of the first clock signal.

3. The integrated circuit of claim 1, further comprising:

a delay chain with an input operatively connected to the first clock signal and an output operatively connected to an edge enable input of the flip-flop.

4. The integrated circuit of claim 3, wherein the delay chain comprises a series of delay elements.

5. The integrated circuit of claim 3, wherein the delay chain is arranged to generate the edge enable input having a toggle between a first transition of the first clock signal and a second transition of the first clock signal.

6. The integrated circuit of claim 1, wherein the flip-flop is arranged to output a first type of edge on the second clock signal upon receipt of a first transition of the first clock signal, and wherein the flip-flop is arranged to output a second type of edge on the second clock signal before receipt of a second transition of the first clock signal.

7. The integrated circuit of claim 6, wherein generation of the second type of edge is dependent on the reset input.

8. The integrated circuit of claim 6, wherein the flip-flop is arranged to output the first type of edge on the second clock signal upon receipt of the second transition of the first clock signal.

9. The integrated circuit of claim 1, wherein the pulse generator comprises:

a logic gate with a first input operatively connected to the second clock signal; and a delay chain with an input operatively connected to the second clock signal and an output operatively connected to a second input of the logic gate.

10. The integrated circuit of claim 1, wherein the voltage controlled delay element comprises a delay chain.

11. An integrated circuit, comprising:

flip-flop means for inputting a first transition of a first clock signal and outputting a first type of edge on a second clock signal upon receipt of the first transition; and means for resetting the flip-flop means before the flip-flop means inputs a second transition of the first clock signal, wherein the flip-flop means outputs a second type of edge on the second clock signal dependent on the means for resetting the flip-flop means.

12. The integrated circuit of claim 11, wherein the flip-flop means outputs the first type of edge on the second clock signal upon receipt of the second transition.

13. The integrated circuit of claim 11, wherein the means for resetting comprises:

means for generating a pulse dependent on the second clock signal; and means for delaying the second type of edge on the second clock signal dependent on the pulse.

14. A method for multiplying a frequency of a first clock signal, comprising:

generating a first type of edge on a second clock signal dependent on a first transition of the first clock signal;

generating a pulse dependent on the first type of edge;

delaying the pulse; and generating a second type of edge on the second clock signal dependent on the pulse, wherein generating the second type of edge occurs before receipt of a second transition of the first clock signal.

15. The method of claim 14 further comprising:

generating the first type of edge on the second clock signal dependent on the second transition of the first clock signal.

\* \* \* \* \*